(12) United States Patent
Czerwonka et al.

(10) Patent No.: US 11,498,386 B2
(45) Date of Patent: Nov. 15, 2022

(54) MULTI-ZONE CLIMATE CONTROL SYSTEM FOR A VEHICLE

(71) Applicant: Harley-Davidson Motor Company Group, LLC, Milwaukee, WI (US)

(72) Inventors: Adam Franklin Czerwonka, Mukwonago, WI (US); Craig Schultz, Greenfield, WI (US); Bryan Thieme, Colgate, WI (US); Andrew Paul Weiss, New Berlin, WI (US); Robert Kenneth Alexander, Jackson, WI (US)

(73) Assignee: Harley-Davidson Motor Company Group, LLC, Milwaukee, WI (US)

( * ) Notice: Subject to any disclaimer, the term of this patent is extended or adjusted under 35 U.S.C. 154(b) by 790 days.

(21) Appl. No.: 16/428,926

(22) Filed: May 31, 2019

(65) Prior Publication Data

US 2019/0366799 A1 Dec. 5, 2019

Related U.S. Application Data

(60) Provisional application No. 62/680,781, filed on Jun. 5, 2018, provisional application No. 62/678,839, filed on May 31, 2018.

(51) Int. Cl.
*B60H 1/00* (2006.01)
*H03K 5/156* (2006.01)
*B60N 2/56* (2006.01)

(52) U.S. Cl.
CPC ..... *B60H 1/00642* (2013.01); *B60H 1/00285* (2013.01); *B60H 1/00292* (2013.01); *B60H 1/00735* (2013.01); *B60H 1/00878* (2013.01); *B60H 1/00892* (2013.01); *B60N 2/56* (2013.01); *B60N 2/5678* (2013.01); *B60N 2/5685* (2013.01); *H03K 5/1565* (2013.01)

(58) Field of Classification Search
CPC ............ B60H 1/00292; B60H 1/00642; B60H 1/00285; B60H 1/00735; B60H 1/00878; B60H 1/00892; B60N 2/56; B60N 2/5678; B60N 2/5685; H03K 5/1565
See application file for complete search history.

(56) References Cited

U.S. PATENT DOCUMENTS

| 6,820,018 | B2* | 11/2004 | Akitaya | ................ G06F 1/3203 |
| | | | | 702/60 |
| 8,958,949 | B2* | 2/2015 | VerWoert | ........... B60H 1/00742 |
| | | | | 701/36 |
| 8,969,703 | B2 | 3/2015 | Makansi et al. | |
| 9,989,282 | B2 | 6/2018 | Makansi et al. | |
| 2012/0060885 | A1 | 3/2012 | Makansi et al. | |
| 2012/0198616 | A1 | 8/2012 | Makansi et al. | |
| 2015/0219368 | A1 | 8/2015 | Makansi et al. | |
| 2021/0276463 | A1* | 9/2021 | Wolas | .................. B60N 2/5642 |

* cited by examiner

*Primary Examiner* — Marc E Norman
(74) *Attorney, Agent, or Firm* — Michael Best & Friedrich LLP

(57) ABSTRACT

Methods and systems for providing multi-zone climate control for a vehicle. One system includes a power source, a plurality of switches, a first zone heating/cooling device, a second zone heating/cooling device, and an electronic controller. The electronic controller is configured to operate the plurality of switches to supply current bi-directionally through the first zone heating/cooling device, bi-directionally through the second zone heating/cooling device, or bi-directionally through a series connection of the first zone heating/cooling device and the second zone heating/cooling device.

20 Claims, 20 Drawing Sheets

| Modes: | COOL | |
|---|---|---|
| # | Driver Temp | Passenger temp |
| 1 | 0 | 0 |
| 2 | 0 | 1 |
| 3 | 0 | 2 |
| 4 | 0 | 3 |
| 5 | 0 | 4 |
| 6 | 1 | 0 |
| 7 | 1 | 1 |
| 8 | 1 | 2 |
| 9 | 1 | 3 |
| 10 | 1 | 4 |
| 11 | 2 | 0 |
| 12 | 2 | 1 |
| 13 | 2 | 2 |
| 14 | 2 | 3 |
| 15 | 2 | 4 |
| 16 | 3 | 0 |
| 17 | 3 | 1 |
| 18 | 3 | 2 |
| 19 | 3 | 3 |
| 20 | 3 | 4 |
| 21 | 4 | 0 |
| 22 | 4 | 1 |
| 23 | 4 | 2 |
| 24 | 4 | 3 |
| 25 | 4 | 4 |

FIG. 3A

| Modes: | HEAT | |
|---|---|---|
| # | Driver Temp | Passenger temp |
| 26 | 0 | 0 |
| 27 | 0 | 1 |
| 28 | 0 | 2 |
| 29 | 0 | 3 |
| 30 | 0 | 4 |
| 31 | 1 | 0 |
| 32 | 1 | 1 |
| 33 | 1 | 2 |
| 34 | 1 | 3 |
| 35 | 1 | 4 |
| 36 | 2 | 0 |
| 37 | 2 | 1 |
| 38 | 2 | 2 |
| 39 | 2 | 3 |
| 40 | 2 | 4 |
| 41 | 3 | 0 |
| 42 | 3 | 1 |
| 43 | 3 | 2 |
| 44 | 3 | 3 |
| 45 | 3 | 4 |
| 46 | 4 | 0 |
| 47 | 4 | 1 |
| 48 | 4 | 2 |
| 49 | 4 | 3 |
| 50 | 4 | 4 |

FIG. 3B

|  | First Switch | Second Switch | Third Switch | Fourth Switch | Fifth Switch | Sixth Switch | Zone(s) Heated or Cooled | Independent or Series |
|---|---|---|---|---|---|---|---|---|
| State 1 | 1 | 0 | 0 | 0 | 1 | 0 | Zone 1 heated | Independent |
| State 2 | 0 | 1 | 1 | 1 | 0 | 0 | Zone 1 cooled | Independent |
| State 3 | 0 | 0 | 1 | 1 | 0 | 0 | Zone 2 heated | Independent |
| State 4 | 0 | 0 | 0 | 1 | 1 | 1 | Zone 2 cooled | Independent |
| State 5 | 1 | 0 | 0 | 0 | 0 | 1 | Zone 1 and Zone 2 heated | Series |
| State 6 | 0 | 1 | 1 | 0 | 1 | 0 | Zone 1 and Zone 2 cooled | Series |

FIG. 3C

|  | First Switch | Second Switch | Third Switch | Fourth Switch | Fifth Switch | Sixth Switch | Zone(s) Heated or Cooled |
|---|---|---|---|---|---|---|---|
| State 7 | 1 | 0 | 0 | 0 | 1 | 1 | Zone 1 heated; Zone 2 cooled |
| State 8 | 0 | 1 | 1 | 1 | 0 | 0 | Zone 2 heated; Zone 1 cooled |
| State 9 | 1 | 0 | 0 | 1 | 1 | 0 | Zone 1 and Zone 2 heated (polarity swapped on Zone 2) |
| State 10 | 0 | 1 | 1 | 0 | 0 | 1 | Zone 1 and Zone 2 cooled (polarity swapped on Zone 2) |

FIG. 3D

| MODE | 1 |
|---|---|
| First Switch | ■ |
| Third Switch | ■ |
| Fifth Switch | ■ |
| Second Switch | ■ |
| Fourth Switch | ■ |
| Sixth Switch | ■ |

FIG. 5A

MULTI-ZONE CLIMATE CONTROL SYSTEM FOR A VEHICLE

RELATED APPLICATIONS

This application claims priority to U.S. Provisional Application No. 62/678,838, entitled "DUAL ZONE CLIMATE CONTROL SYSTEM FOR A VEHICLE," filed May 31, 2018, and U.S. Provisional Application No. 62/680,781, entitled "DUAL ZONE CLIMATE CONTROL SYSTEM FOR A VEHICLE," filed Jun. 5, 2018, the entire content of both prior-filed applications is hereby incorporated by reference.

FIELD

Embodiments described herein to a multi-zone climate control system for surfaces of a vehicle, such as a seats in a motorcycle.

SUMMARY

To achieve peak cooling performance, the heating and/or cooling elements (sometimes also referred to as ribbons) of seats and other surfaces in vehicles are required to operate at a specific setpoint current (current passing through the elements). When more than one surface is being heated or cooled, a conventional solution is to set up two individual (separate) heating/cooling zones and control each zone to the desired temperature set points of both the driver and the passenger. In some implementations, however, these individual zones may require up to double the input current draw from a power source. Additionally, each individual temperature zone increases the amount of circuity and components included in the vehicle, which impacts complexity and cost.

Embodiments described herein provide multi-zone temperature control solutions that address these and other issues. In particular, in some embodiments, the systems and methods described herein use a control algorithm that allows multiple heating/cooling elements to be connected in series so that current can be fed to the heating/cooling elements bidirectional through each zone independently, bi-directionally in a series connection, or bi-directionally in a parallel connection. The control algorithm defines the allowable switch states and the transitions between the switch states. Furthermore, in some embodiments, the control algorithm allows for feedback wherein dynamic, continuous adjustments can be applied to the duty cycle supplied to the heating/cooling elements based on a difference (an error) between a measured temperature and a user-selected setpoint temperature by extending or shortening the time within a particular switch state. In other embodiments, however, the control algorithm supports operation where user control translates directly into a duty cycle of the heating/cooling elements without a continuous adjustment of the duty cycle that temperature feedback enables. This direct duty cycle control provides temperature control indirectly as an open loop system. In some embodiments, the control algorithm uses different controls or loops depending on whether the elements are being heated or cooled. In particular, a closed loop operation could be used for heating and a modified open loop could be used for cooling. However, in other embodiments, the same closed loop control could be used for both heating and cooling. In the open loop, a duty cycle is held based on a user-selected temperature setting without the added feedback of a temperature measure. As described above, the control can be used to continuously adjust the duty cycle to hold a temperature setpoint as a closed loop system.

Some open loop embodiments also ramp temperature quickly by overriding the duty cycle command and setting full duty cycle for a period of time calculated based on the initial operating point vs the user setting. After the period of time expires, the control algorithm returns to a user-controlled duty cycle until a new setpoint is received from the user. By doing so, the temperature ramps to a steady state faster. In some embodiments, rather than overriding duty cycle as described above to quickly achieve a steady state, a temperature sensor can be used to measure ambient conditions. In this embodiment, the control algorithm drives the closed loop to a desired difference between ambient temperature and seat surface temperature. In some embodiments, an ambient temperature sensor may be positioned anywhere on a vehicle and may communicate with the systems and methods described herein via a communication bus, such as a controller area network (CAN) bus.

Accordingly, in some embodiments, the control algorithm provides a modulation signal that can vary pulse width to switches (e.g., in a control bridge) to operate at a duty cycle setpoint in an open loop with a reduction in time to a steady state or have a continuously variable duty cycle that controls the temperature at a surface to a temperature setpoint as a closed loop system. In other words, varying the pulse width and timing of switches (fed by a power supply) combined with temperature feedback (of the heating/cooling elements or a surface associated therewith) allows regulation of the temperature of the surface to a desired temperature setpoint as a closed loop system. Alternatively, the systems and method can use a related control scheme to run the system multiple setpoints as an open loop control with a temperature ramp timer that approximates the amount of time needed at full duty cycle to reach steady state operation. As a result, some methods and systems described herein minimize input current draw required, minimize the number of switches in a bridge, and requires only one power supply, such as a current-regulated switched-mode power supply.

For example, one embodiment provides a system for providing multi-zone climate control for a vehicle. The system includes a power source, a plurality of switches, a first zone heating/cooling device, a second zone heating/cooling device, and an electronic controller. The plurality of switches includes a first switch coupled between the power source and a first junction, a second switch coupled between the first junction and a reference terminal, a third switch coupled between the power source and a second junction, a fourth switch coupled between the second junction and the reference terminal, a fifth switch coupled between the power source and a third junction, and a sixth switch coupled between the third junction and the reference terminal. The first zone heating/cooling device is coupled between the first junction and the second junction, and the second zone heating/cooling device is coupled between the second junction and the third junction. The electronic controller is configured to operate the plurality of switches to supply current bi-directionally through the first zone heating/cooling device, bi-directionally through the second zone heating/cooling device, or bi-directionally through a series connection of the first zone heating/cooling device and the second zone heating/cooling device.

Another embodiment provides a method of operating a multi-zone climate control system for a vehicle. The method includes receiving a first temperature selection associated with a first zone heating/cooling device included in the vehicle and receiving a second temperature selection associated with a second zone heating/cooling device included in the vehicle. The method also includes, in response to the first temperature selection being an OFF level and the second temperature selection not being an OFF level, operating, with an electronic controller, a plurality of switches included in the vehicle to place the plurality of switches in a first state to supply current to the second zone heating/cooling device and to not supply current to the first zone heating/cooling device. The method further includes, in response to the first temperature selection not being an OFF level and the second temperature selection being an OFF level, operating, with the electronic controller, the plurality of switches to place the plurality of switches in a second state to supply current to the first zone heating/cooling device and to not supply current to the second zone heating/cooling device. In addition, the method includes, in response to the first temperature selection not being an OFF level and the second temperature selection not being an OFF level, operating, with the electronic controller, the plurality of switches to place the plurality of switches in a third state to connect the first zone heating/cooling device and the second zone heating/cooling device in series and supply current to both the second zone heating/cooling device and the first zone heating/cooling device.

Other embodiments described herein provide multi-zone climate control systems and methods. In one embodiment, the multi-zone climate control system includes heating/cooling elements for a first seat (e.g., a driver seat), heating/cooling elements for a second seat (e.g., a passenger seat), and a control circuit. The control circuit is configured to connect the driver seat heating/cooling elements and the passenger seat heating/cooling elements in series. The control circuit is also configured to connect the driver seat heating/cooling elements and the passenger seat heating/cooling elements in parallel. The control circuit is also configured to disconnect the driver seat heating/cooling elements from the passenger seat heating/cooling elements to operate the elements for each seat independently. The control circuit is further configured to activate a constant current control loop for at least one selected from a group consisting of the driver seat heating/cooling elements and passenger seat heating/cooling elements.

In some embodiments, the control circuit includes a two H-bridge configuration with four legs and a bridge connection switch that provides a two-zone system. However, in other embodiments, the control circuit includes a connected group of three legs (each a half bridge), which reduces the amount of circuitry included in the system. In particular, the series path between the two zones created by the connection scheme provided by the 3-leg configuration simplifies hardware and results in a novel, bidirectional control scheme. In some embodiments, current draw from the system voltage bus is restricted through fuses and/or through solid state load switches acting as circuit breakers. Reducing the current draw of devices on this circuit places less strain on the vehicle's electrical system and allows additional accessories to be equipped within the available current budget. Reduced circuit cost, complexity, and reduced system development all support a more cost effective product within a given set of product functions. For example, applying current through fewer devices generally results in power savings, which can be important for vehicles, including electric or hybrid vehicles.

Other aspects of the disclosure will become apparent by consideration of the detailed description and accompanying drawings.

BRIEF DESCRIPTION OF THE DRAWINGS

FIGS. 3A and 3B are tables representing possible operating modes of the system of FIG. 1 in accordance with some embodiments.

FIGS. 3C and 3D are tables representing states of switches included in the system of FIG. 1 in accordance with some embodiments.

DETAILED DESCRIPTION

Before any embodiments of the disclosure are explained in detail, it is to be understood that the disclosure is not limited in its application to the details of construction and the arrangement of components set forth in the following description or illustrated in the following drawings. The disclosure is capable of other embodiments and of being practiced or of being carried out in various ways.

The phrase "connected in series" as used herein refers to a circuit arrangement in which the described elements are arranged, in general, in a sequential fashion such that the output of one element is coupled to the input of another, though the same current may not pass through each element. For example, when elements are "connected in series," additional circuit elements may be connected in parallel with one or more of the elements "connected in series" Furthermore, additional circuit elements can be connected at nodes in the series-type configuration such that branches in the circuit are present. Therefore, elements connected in series do not necessarily form a true "series circuit."

Additionally, the phrase "connected in parallel" as used herein refers to a circuit arrangement in which the described elements are arranged, in general, in a manner such that one element is connected to another element, such that the circuit forms a parallel branch of the circuit arrangement. In such a configuration, the individual elements of the circuit may not have the same potential difference across them individually. For example, two circuit elements connected in parallel with one another may be connected in series with one or more additional elements of the circuit. Therefore, a circuit including elements "connected in parallel" can include elements that do not necessarily individually form a true "parallel circuit."

Figure 1:
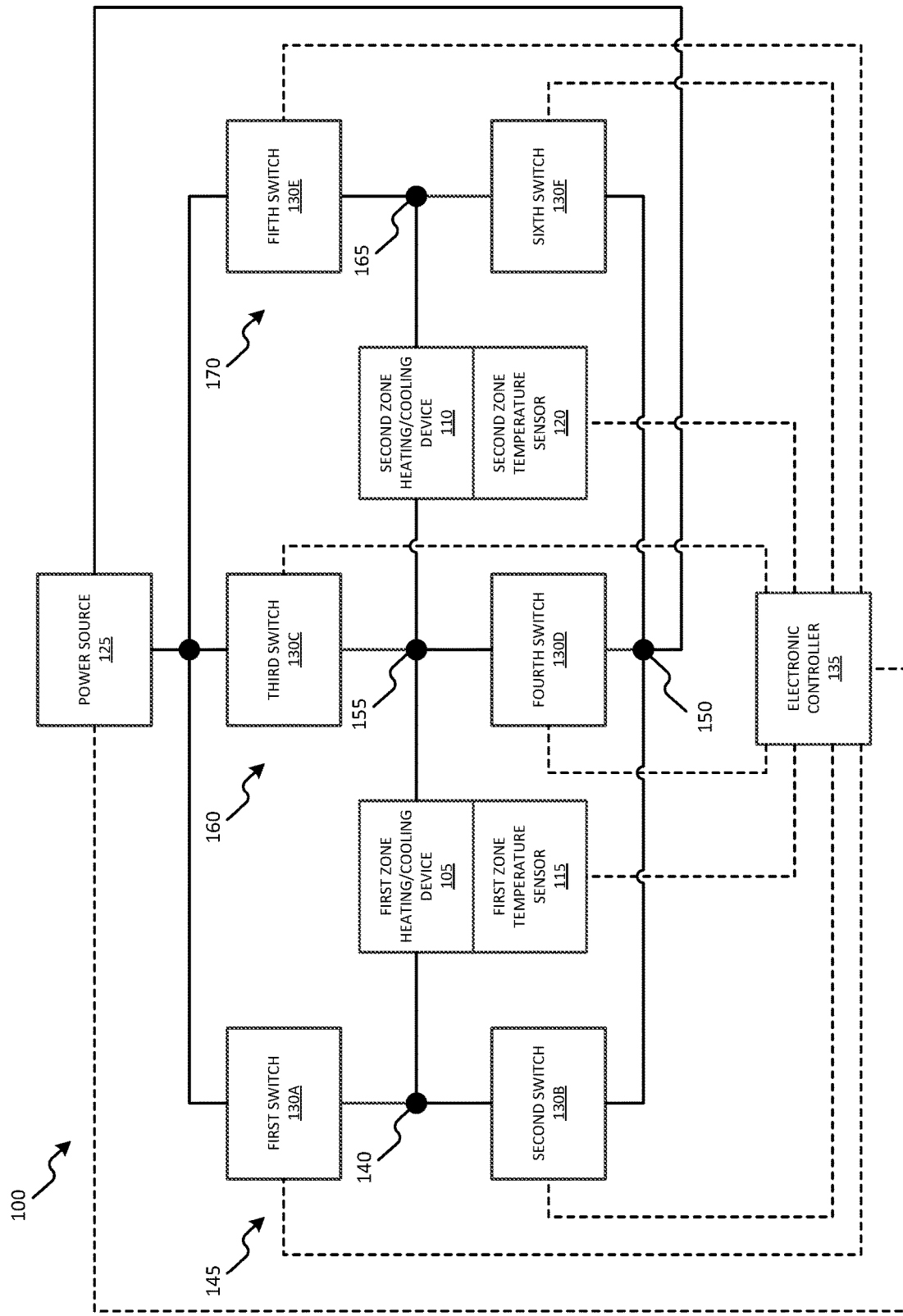
FIG. 1 is a diagram of a multi-zone climate control system for a vehicle, in accordance with some embodiments.

FIG. 1 is a diagram of one example embodiment of a multi-zone climate control system 100 for a vehicle (for example, a motorcycle). In the embodiment illustrated in FIG. 1, the multi-zone climate control system 100 includes a first zone heating/cooling device 105 (defining a first zone), a second zone heating/cooling device 110 (defining a second zone), a first zone temperature sensor 115, a second zone temperature sensor 120, a power source 125, a plurality of switches 130A through 130F, and an electronic controller 135. In alternate embodiments, the multi-zone climate control system 100 may include fewer or additional components in configurations different from the configuration illustrated in FIG. 1.

The first zone heating/cooling device 105 include electronic devices that heat and cool the driver seat. For example, the first zone heating/cooling device 105 may include one or more Peltier devices, one or more fans that blow cool air throughout the seating material to cool the surface of the seat, one or more compressors, one or more resistive elements that heat up when electrical current is run through them, or any combination thereof. The second zone heating/cooling device 110 include electronic devices that heat and cool the passenger seat. In some embodiments, the second zone heating/cooling device 110 includes all or any combination of the example zone heating/cooling devices described above 110.

The first zone temperature sensor 115 is configured to measure the temperature of the driver seat and send a driver temperature feedback signal to the electronic controller 135 indicating the measured temperature of the driver seat. The second zone temperature sensor 120 is configured to measure the temperature of the passenger seat and send a passenger temperature feedback signal to the electronic controller 135 indicating the measured temperature of the passenger seat.

The power source 125 supplies current and/or voltage to the first zone heating/cooling device 105 and the second zone heating/cooling device 110. In some embodiments, the power source 125 includes a switched-mode power supply, a linear power supply, or a battery. In some embodiments, the power source 125 represents a single current source. However, it should be understood that embodiments described herein may be used with a single voltage source.

The first switch 130A and the second switch 130B are coupled at a first junction 140 to form a first half-bridge switching leg 145. The first switch 130A is coupled between the power source 125 and the first junction 140. The second switch 130B is coupled between the first junction 140 and a reference terminal 150 (for example, a ground terminal). The third switch 130C and the fourth switch 130D are coupled at a second junction 155 to form a second half-bridge switching leg 160. The third switch 130C is coupled between the power source 125 and the second junction 155. The fourth switch 130D is coupled between the second junction 155 and the reference terminal 150. The fifth switch 130E and the sixth switch 130F are coupled together at a third junction 165 to form a third half-bridge switching leg 170. The fifth switch 130E is coupled between the power source 125 and the third junction 165. The sixth switch 130F is coupled between the third junction 165 and the reference terminal 150.

In some embodiments, one or more of the switches 130A through 130F include current measuring devices, such as resistors in series. For example, in some embodiments, the top side switches (switches 130A, 130C, and 130E) include integral current sensing and the bottom side switches (switches 130B, 130D, and 130F) include discrete resistors in series (each connected to ground). Current sensing may be used in configurations of the system 100 using parallel operation (e.g., with two or more resistive elements of substantially different values) as a way to balance current.

The first zone heating/cooling device 105 is coupled between the first junction 140 of the first half-bridge switching leg 145 and the second junction 155 of the second half-bridge switching leg 160. The second zone heating/cooling device 110 is coupled between the second junction 155 of the second half-bridge switching leg 160 and the third junction 165 of the third half-bridge switching leg 170. The first half-bridge switching leg 145 and the second half-bridge switching leg 160 together form an H-bridge which controls the polarity of voltage (or the direction of current) applied to the first zone heating/cooling device 105. The second half-bridge switching leg 160 and the third half-bridge switching leg 170 together form another H-bridge which controls the polarity of voltage (or the direction of current) applied to the second zone heating/cooling device 110. The first half-bridge switching leg 145 and the third half-bridge switching leg 170 together form another H-bridge which controls the polarity of voltage (or the direction of current) applied to the series connection of the first zone heating/cooling device 105 and the second zone heating/cooling device 110.

As illustrated in FIG. 1, the switches can be used controlled to form a parallel circuit. For example, in some embodiments, the first switch 130A, fourth switch 130D, and fifth switch 130E can form a parallel circuit as can the second switch 130B, third switch 130C, and sixth switch 130F to, for example, control the direction of current and polarity. As noted elsewhere in the present application, parallel circuits can be used in some configurations of the system 100, such as to provide simultaneous heating and cooling of different zones.

Figure 2:
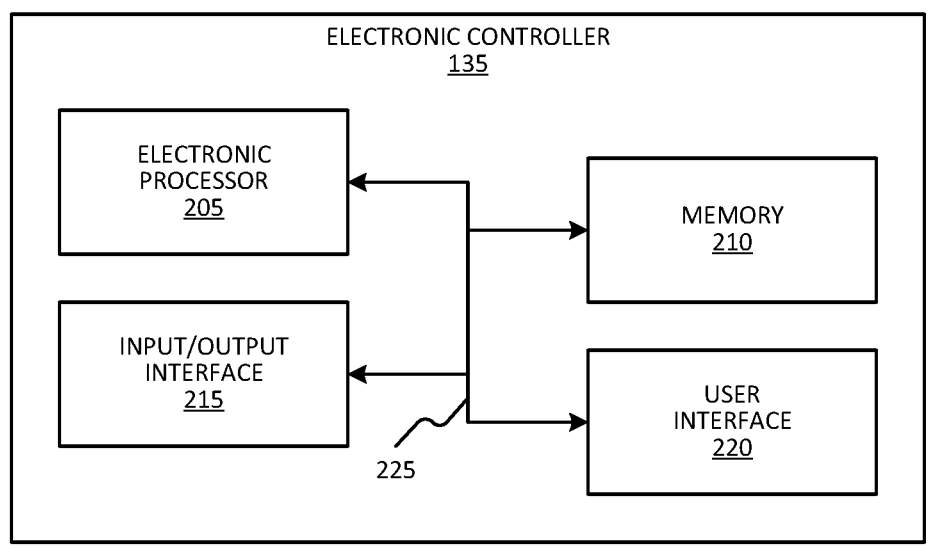
FIG. 2 is a diagram of an electronic controller included in the multi-zone climate control system of FIG. 1, in accordance with some embodiments.

FIG. 2 is a diagram of one example embodiment of the electronic controller 135 included in the system 100. In the embodiment illustrated in FIG. 2, the electronic controller 135 includes an electronic processor 205 (for example, a microprocessor), a memory 210, an input/output interface 215, and a user interface 220. The electronic processor 205, the memory 210, as well as the other various modules are coupled by a bus 225 (for example, a controller area network (CAN) bus), or are coupled directly, by one or more additional control or data buses, or a combination thereof. The memory 210 may include read only memory (ROM), random access memory (RAM), other non-transitory computer-readable media, or a combination thereof. The electronic processor 205 is configured to retrieve program instructions and data from the memory 210 and execute, among other things, instructions to perform the methods described herein.

The input/output interface 215 includes routines for transferring information between components within the electronic controller 135 and other components of the multi-zone climate control system 100, as well as components external to the multi-zone climate control system 100. The input/output interface 215 is configured to transmit and receive signals via wires, fiber, wirelessly, or a combination thereof. Signals may include, for example, information, data, serial data, data packets, analog signals, or a combination thereof.

The user interface 220 is included to control the electronic controller 135 or the operation of the multi-zone climate control system 100 as a whole. The user interface 220 can include any combination of digital and analog input devices required to achieve a desired level of control for the system. In some embodiments, the user interface 220 includes one or more electronic devices for receiving user input such as knobs, dials, switches, buttons, faders, and the like. Alternatively or in addition, the user interface 220 includes a touch sensitive interface. For example, in some embodiments, the user interface 220 includes a touch-screen display that receives user input using detected physical contact (for example, detected capacitance or resistance). Based on the user input, the touch-screen display screen outputs signals to the electronic processor 205 which indicate positions on the touch-screen display screen currently being selected by physical contact. In some embodiments, the user interface 220 is separate from the electronic controller 135.

The user interface 220 receives a selection of one or more desired heating/cooling settings from a user that represent or translate to a mode of operation of the system 100. For example, in some embodiments, the user interface 220 includes a heat/cool selection device and a plurality of temperature selectors (one for each zone). In some embodiments, the heat/cool selection devices includes a 2-state switch, such as a two-position rocker switch, that allows a user to select between heating and cooling. In some embodiments, the temperature selector for each zone includes a rotary dial. For example, the user interface 220 may include a first rotary dial for the first zone heating/cooling device 105 and a second rotary dial for the second zone heating/cooling device 110. In some embodiments, each rotary dial has five positions, wherein a position 0 represents "OFF" and positions 1 through 4 represent temperature levels or intensities (associated with temperature setpoints used by the system 100), wherein position 1 is the lowest heating or cooling level and position 4 is the highest heating or cooling level. In some embodiments, the rotary dials may be positioned at different positions within the vehicle to be within reach of the driver and the passenger respectively. As the driver seat and the passenger are controlled independently, the positions of the rotary dials can be set independently. It should be understood that the particular type of user input device used to select between heating and cooling and a particular heating or cooling level for a temperature-controlled zone can vary and the switches and dials described herein are provided as examples. For example, in some embodiments, a touch screen may receive user selections of one or more heating/cooling settings. Furthermore, in some embodiments, additional or fewer temperature levels may be provided for the temperature-controlled zones. In fact, in some embodiments, a different number of available temperature levels may be provided for different zones.

FIGS. 3A and 3B are tables representing different possible operating modes for the system 100 depending on the heating/cooling settings selected by a user in accordance with some embodiments of the invention. As used in the present application, a "mode" represents conditions of user input (a specific combination of heating/cooling settings). To achieve each operating mode, the switches 130A through 130F included in the system 100 are controlled to operate in one or more states, wherein a "state" represents a condition of the switches 130A through 130F (i.e., what switches are open and what switches are closed). Accordingly, there can be one or more states during each period of an operating mode.

For example, six states of the switches 130A through 130F (plus an "OFF" state where all of the switches 130A through 130F are open) can be used to heat and cool the first zone and the second zone. FIG. 3C illustrates these six states according to some embodiments. As illustrated in FIG. 3C, in State 1, the first switch 130A and the fourth switch 130D are closed (or referred to as being "on"), which results in the first zone being heated (independent of the second zone, which receives no heating in this state). In State 2, the second switch 130B and the third switch 130C are closed, which results in the first zone being cooled (independent of the second zone, which receives no heating in this state). In State 3, the third switch 130C and the sixth switch 130F are closed, which results in the second zone being heated (independent of the first zone, which receives no heating in this state). In State 4, the fourth switch 130D and the fifth switch 130E are closed, which results in the second zone being cooled (independent of the first zone, which receives no cooling in this state). In State 5, the first switch 130A and the sixth switch 130F are closed, which results in both the first zone and the second zone being heated. In State 6, the second switch 130B and the fifth switch 130E are closed, which results in both the first zone and the second zone being cooled.

When parallel operation is used, further states of the switches 130A through 130F can be used as illustrated in FIG. 3D. For example, two additional states are used when parallel operation is used and these additional parallel states can be expanded into four states based on the polarity of the heating/cooling elements. In particular, polarity may need to be swapped on one zone to get heating through both zones in one direction and cooling in the other zone. In other words, the system 100 is capable (electrically) of controlling one zone to cool and another zone to heat simultaneously. For example, the system 100 could switch between operating each zone independently within each period, which may be two seconds in some embodiments. For example, for each two second period, one zone operates independently for one second and then the other zone is controlled independent for the next second such that, integrated over time, one zone could be cooled and another zone could be heated.

In each of the states, the electronic controller 135 operates (i.e., selectively opens and closes) the plurality of switches 130A through 130F to pass current through the first zone heating/cooling device 105, the second zone heating/cooling device 110, or both. For example, in State 1, the electronic controller 135 sends control signals that cause the first switch 130A and the fourth switch 130D to periodically close while the other switches remain open, such that pulses of current only pass through the first zone heating/cooling device 105. In some embodiments, the electronic controller 135 sends a constant current control signal to the power source 125 that causes the power source 125 to apply a drive current to the first zone heating/cooling device 105.

In State 1 or any of the other states, the electronic controller 135 can monitor the drive current applied by the power source 125 via a current feedback signal. The electronic controller 130 may monitor the current feedback signal, the driver temperature feedback signal, or both at a rate less than or equal to the close rate of the electronic processor 205. The electronic controller 135 adjusts the power output delivered to the first zone heating/cooling device 105 through a pulse width modulated (PWM) signal of varying duty cycle (although varying current amplitude could be used as an alternative). As a result, a constant current drive (between, for example, approximately 2 to approximately 4 Amps) is delivered to the appropriate heating/cooling device and the requested surface temperature value is maintained.

Figure 4:
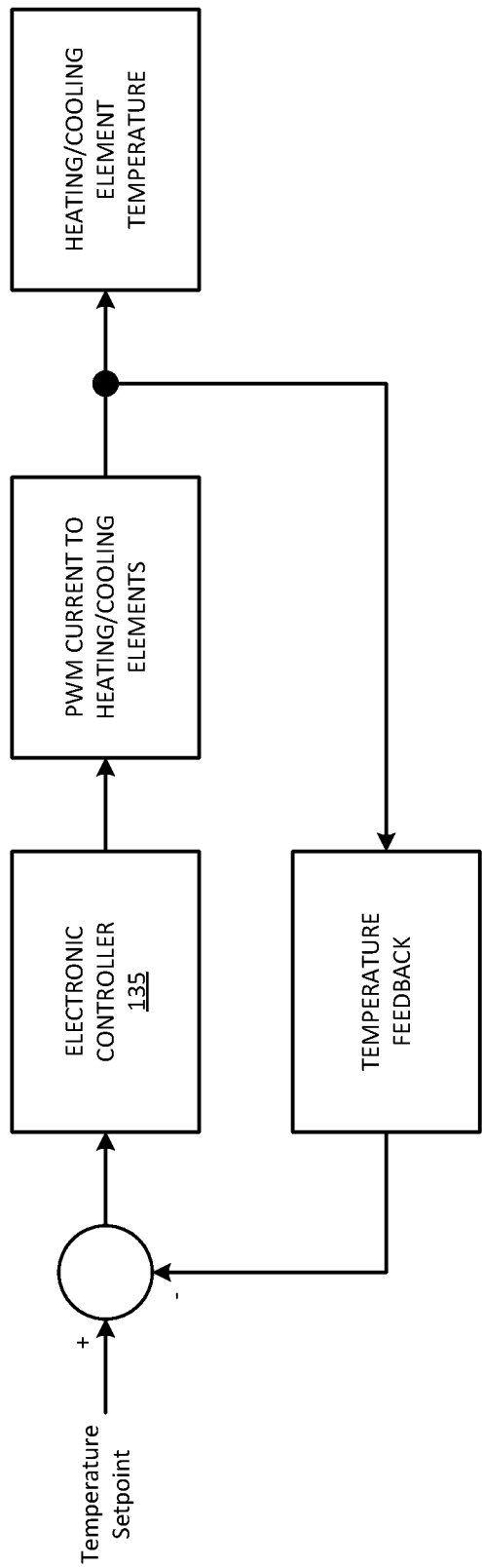
FIG. 4 is a diagram of a temperature control loop in accordance with some embodiments.

FIG. 4 illustrates a temperature control loop in accordance with some embodiments. The current regulation provided via the illustrated loop can be integrated into the control loop for the system 100. However, in other embodiments, the constant current control loop is implemented via a controller or integrated circuit (IC) separate from the control of the switches 130A through 130F implemented via the electronic controller 135 (except that the electronic controller 135 direct the flow of current and turns the current source on and off). In some embodiments, the control loop does not regulate the current setpoint directly. Rather, the control loop controls the average or root mean square (RMS) current by pulse width modulating ("PWM'ing") the enable or the output of a set current source controller IC.

In some embodiments, the temperature control loop illustrated in FIG. 4 can be used for any of the states. However, in some embodiments, the electronic controller 135 only uses the closed loop provided via the temperature feedback signal when heating the first zone, the second zone, or both and uses the open loop when cooling. However, drive current can be monitored in any state. For example, when temperature is controlled by adjusting an amplitude of current (instead of or in addition to the duty cycle), monitoring may be performed in each state.

Also, in some embodiments, in any of the states, to decrease a time to settling or reaching a steady state (a desired temperature), a timer-limited proportional (P) type control, a proportional-integral (PI) type control, or a proportional-integral-derivative (PID) type control can be used, which may use feedback from a temperature sensor. The timer duration for these controls can be set based on a temperature error signal (difference between current temperature and desired temperature). After the timer expires, control can return to open loop control.

Returning to FIG. 3C, in State 2, the electronic controller 135 sends control signals that cause the second switch 130B and the third switch 130C to periodically close while the other switches remain open, such that pulses of current only pass through the first zone heating/cooling device 105 for cooling purposes.

In States 3 and 4, the electronic controller 135 operates similar to the operation described above with respect to States 1 and 2, but controls the state of the switches 130A through 130F as set forth in the table of FIG. 3C to heat or cool the second zone as compared to the first zone. The electronic controller 135 may provide similar monitoring and closed loop control during one or both of these states as also described above with respect to States 1 and 2.

In State 5, the electronic controller 135 sends control signals that cause the first switch 130A and the sixth switch 130F to periodically close while the other switches remain open, such that pulses of current pass through both the first zone heating/cooling device 105 and the second zone heating/cooling device 110 in series and heat both the first zone and the second zone. In particular, closing the first switch 130A and the sixth switch 130F connects the first zone heating/cooling device 105 and the second zone heating/cooling device 110 in series such that equal pulses (in terms of amplitude) pass through the first zone heating/cooling device 105 and the second zone heating/cooling device (the durations of the pulses may not be equal in some situations). During State 5, the electronic controller 135 may also perform monitoring and closed loop control as described above.

The duty cycle of the current pulses applied to both devices 105 and 110 are set based on the feedback of the temperature sensor in conjunction with the controller type (P, PI, PID, or other) being implemented. In some embodiments, the control could determine the difference between the temperature setpoint and the measured value (the existing error, as well as the polarity of the error), the persistence of the error, the rate of change in error, or a combination thereof. In some embodiments, the control is limited to a set of states based on the mode and the reaction require to move the temperature of each device in the correct direction. In addition, in some embodiments, the duty cycle of the current pulses are set directly from the user-selected temperature level for each zone. For example, in an open loop control, the electronic controller 135 may increase the duty cycle when the temperature level is set to a higher intensity as compared to when the temperature setting is set to a lower intensity level. However, in closed loop control, the duty cycle for both zones could be at 100% for a portion of time even when the temperature levels are different. The duty cycles could, however, reduce as a zone reaches its temperature setpoint. In some embodiments, the system could drive to the setpoint using cooling states when above a heat state setpoint or use heating states when below a cooling state setpoint. In other embodiments, the control may turn off when above a heating setpoint or below a cooling setpoint. Also, in some embodiments, activation and/or control of a secondary device, such as a fan, may be used to assist in stabilizing an overshoot past a setpoint.

Accordingly, when a user makes a new temperature selection (via use of a rotary knob or dial as described herein), a new duty cycle can be determined based on the new temperature selection. However, as an open loop system, for quick ramp up to a selected temperature, a period of time can be determined based on a difference between the new temperature selection and the previous selection. During this time, a predetermined duty cycle, such as, for example, a full duty cycle (100%), can override the control. However, after this time, the duty cycle can be returned automatically to the user temperature selection.

Similarly, in State 6, the electronic controller 135 sends control signals that cause the second switch 130B and the fifth switch 130E to periodically close at the same time while the other switches remain open such that pulses of current pass through both the first zone heating/cooling device 105 and the second zone heating/cooling device 110 in series and cool both the first zone and the second zone. In some embodiments, in State 6, the electronic controller 135 operates similar as in State 5 but performing cooling rather than heating. However, as noted above, in some embodiments, during cooling, the electronic controller 135 uses open loop control as compared to closed loop control.

Figure 5B:
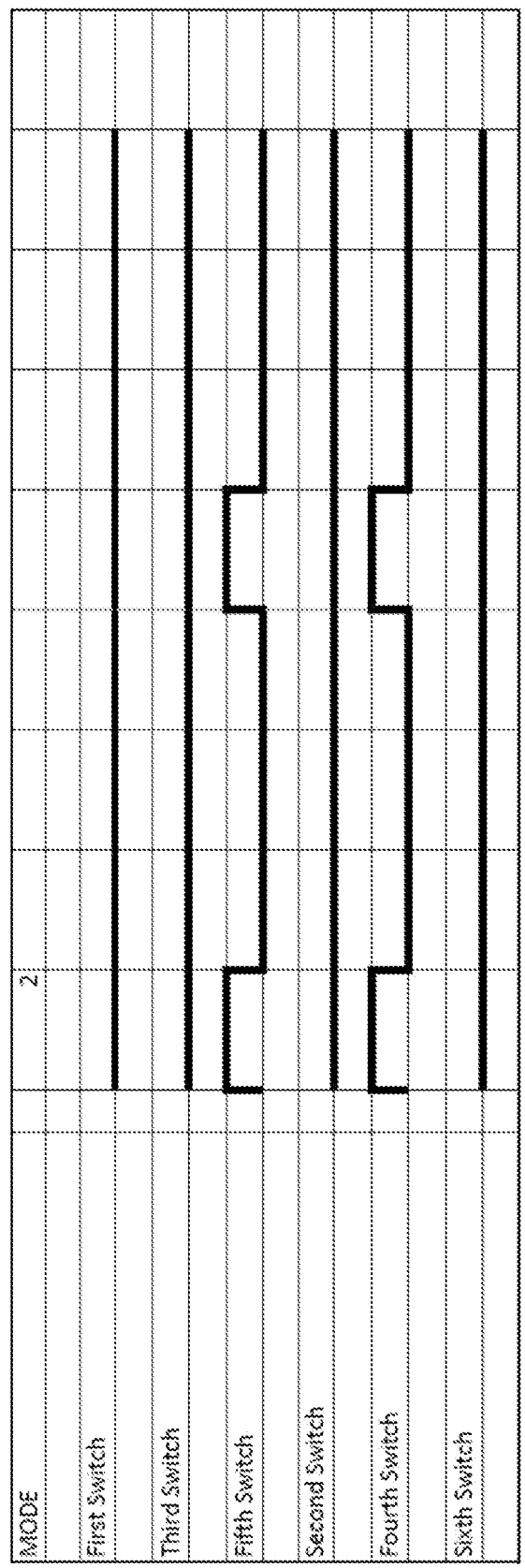
FIGS. 5A through 5N represent waveforms of switch states (four per period) during two periods for some of the operating modes (in an open loop) set forth in FIGS. 3A and 3B in accordance with some embodiments.
Figure 5C:
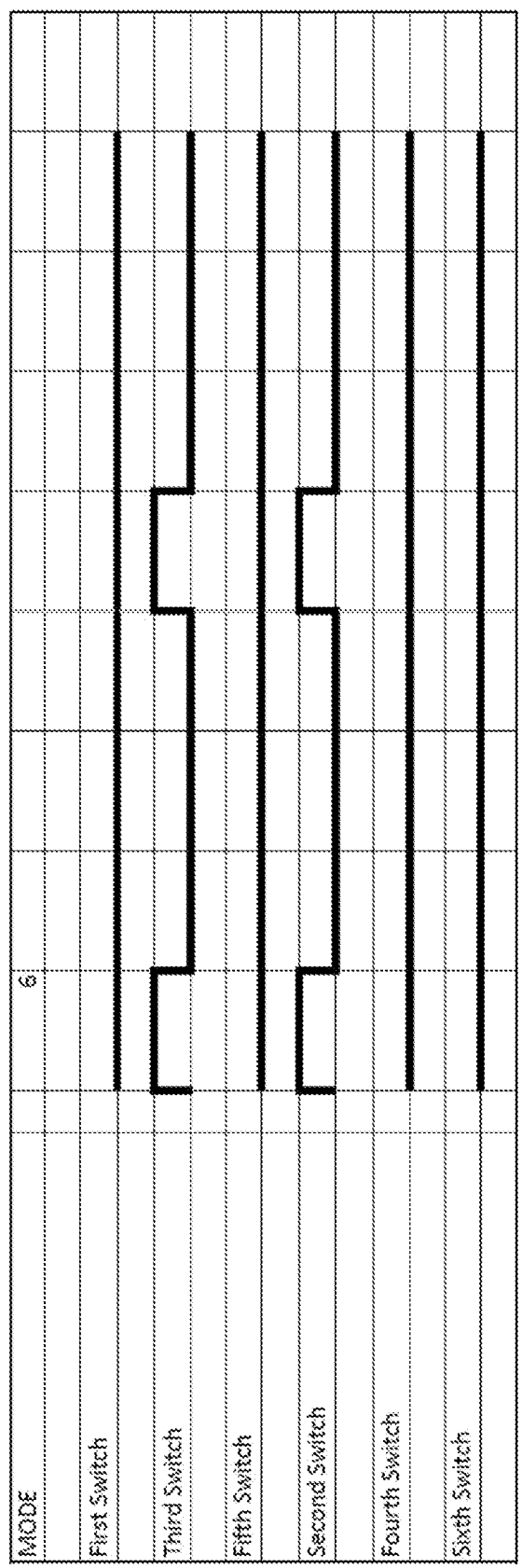
Figure 5D:
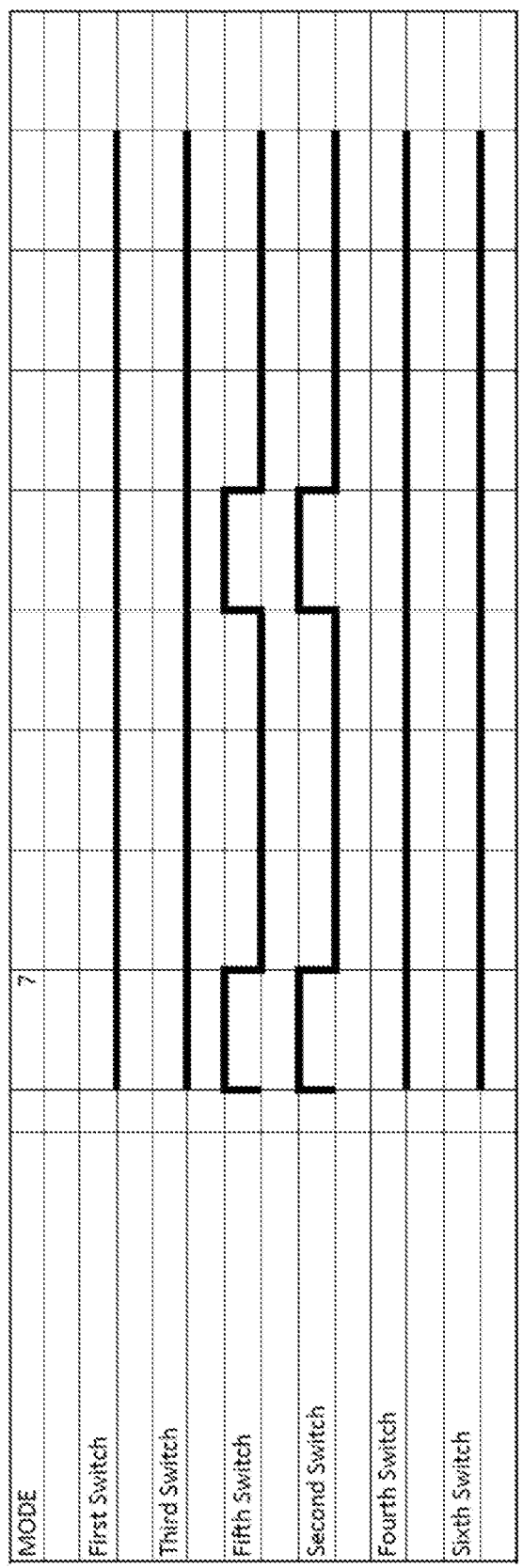

It should also be understood that some states of the switches 130A through 130F may be restricted, such as to prevent short circuiting the system. Furthermore, it should be understood that additional transitional states may be used. For example, the waveforms described below with respect to FIGS. 5A through 5N illustrating the use of the six states described above are idealized in the sense that transitions are not shown in these waveforms. However, in application, heating and cooling may not be simply togged without one or more OFF or transitional conditions being achieved.

As noted above, for each period of an operating mode, one or more states of the switches are used. For example, FIGS. 5A through 5N include waveforms representing states (open or close) of the switches 130A through 130F included in the system 100 during two periods of each of the operating modes illustrated in FIGS. 3A and 3B. In particular, the mode number included in FIGS. 5A through 5N represent the modes identified in FIGS. 3A and 3B. The modes illustrated in FIGS. 3A and 3B and the corresponding waveforms in FIGS. 5A through 5N illustrate examples of the open loop nature of the control and establish the methodology of switch states. In particular, the waveforms illustrate the cycling between series, independent, and off states (the six states representing FIG. 3C plus the additional "Off" state not illustrated), which provides a method that trims off duration of current to the zone needing a lower duty cycle (in both directions). The waveforms illustrate the use of bi-directional control with the hardware included in the system 100, including the states of the switches 130A through 130F. The waveforms illustrated in FIGS. 5A through 5N provide examples of what the states of the switches 130A through 130F may look like for two periods (as an example, illustrating the aspect of time, four switch states are shown per period, wherein each time slice represents a quarter of a second. The two periods shown for each mode are duplicated showing the open loop control (unchanging duty cycle that is the direct control of a user). A high value in a particular time slice represents that current is flowing through the respective switch (the switch is closed). Transitional states not shown may include switches turned on (closed) that do not have current flowing through them. In some embodiments, the current amplitude provided to each switch varies but may be between 2 and 4 Amps. Duty settings (e.g., in an open loop control) may vary based on the selected temperature setting. For example, using the rotary dials described above, when the temperature setting is "OFF" (position 0), the duty cycle is set to 0%. However, when the temperature setting is set via position 1, 2, 3, or 4, the duty cycle may be set to 25%, 50%, 75%, and 100%. However, the system 100 is not limited to just four levels and, if an analog system were used, a continuously variable duty cycle could be used.

Figure 5E:
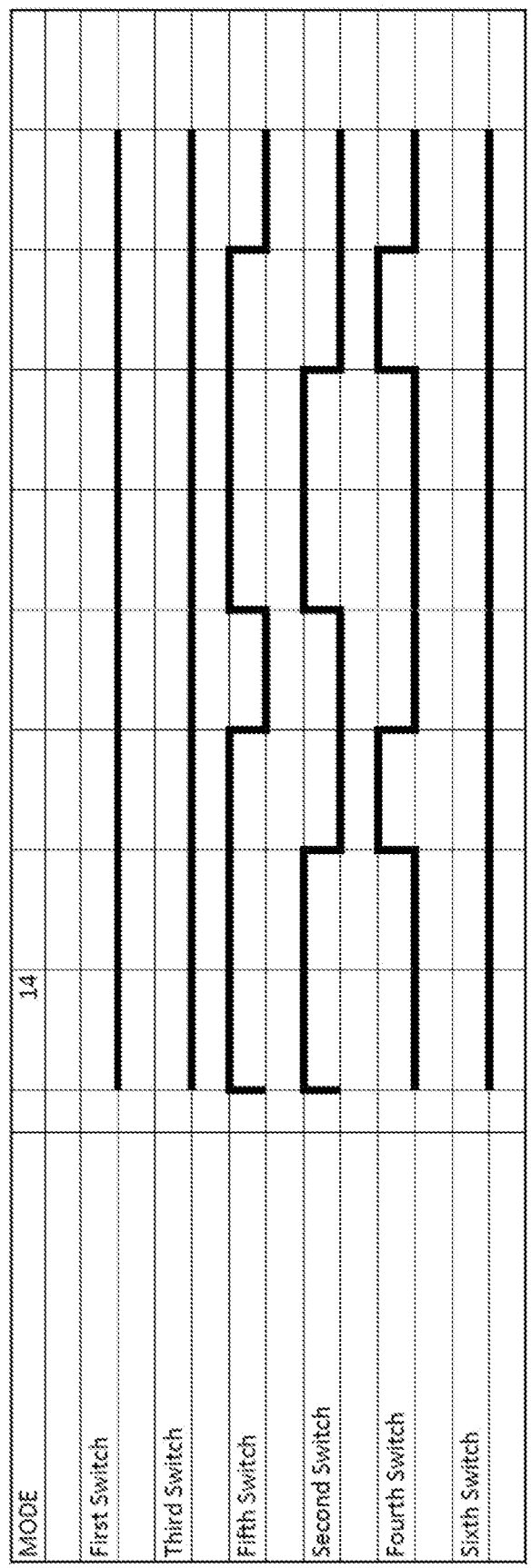
Figure 5F:
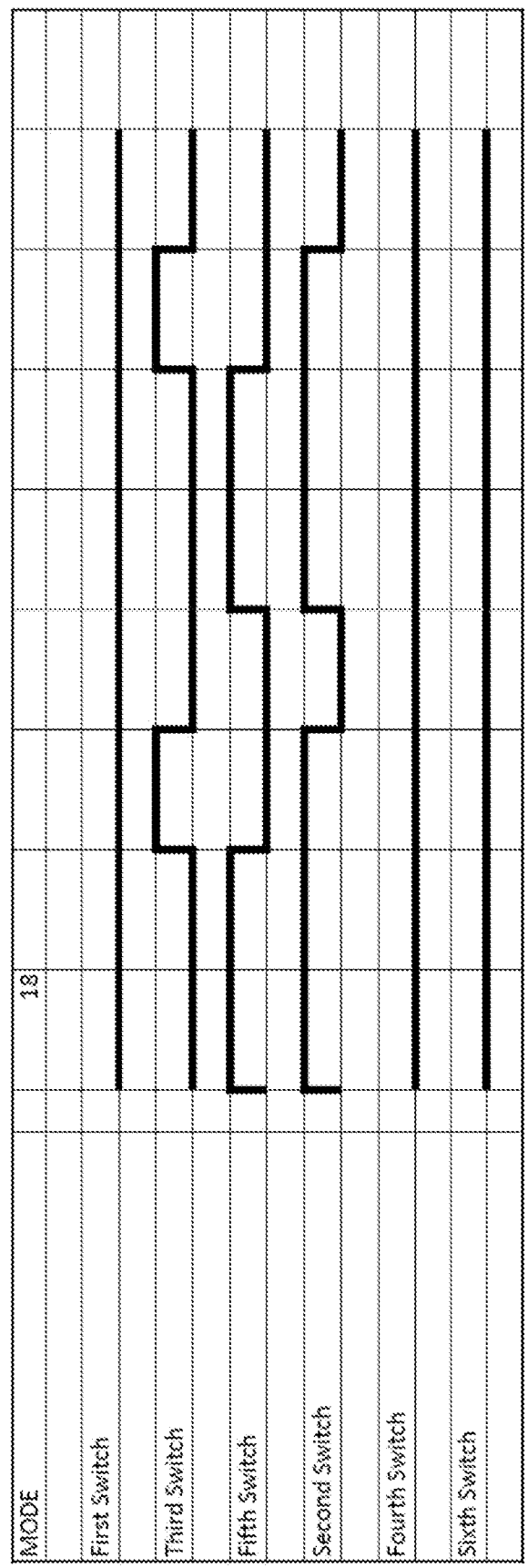
Figure 5G:
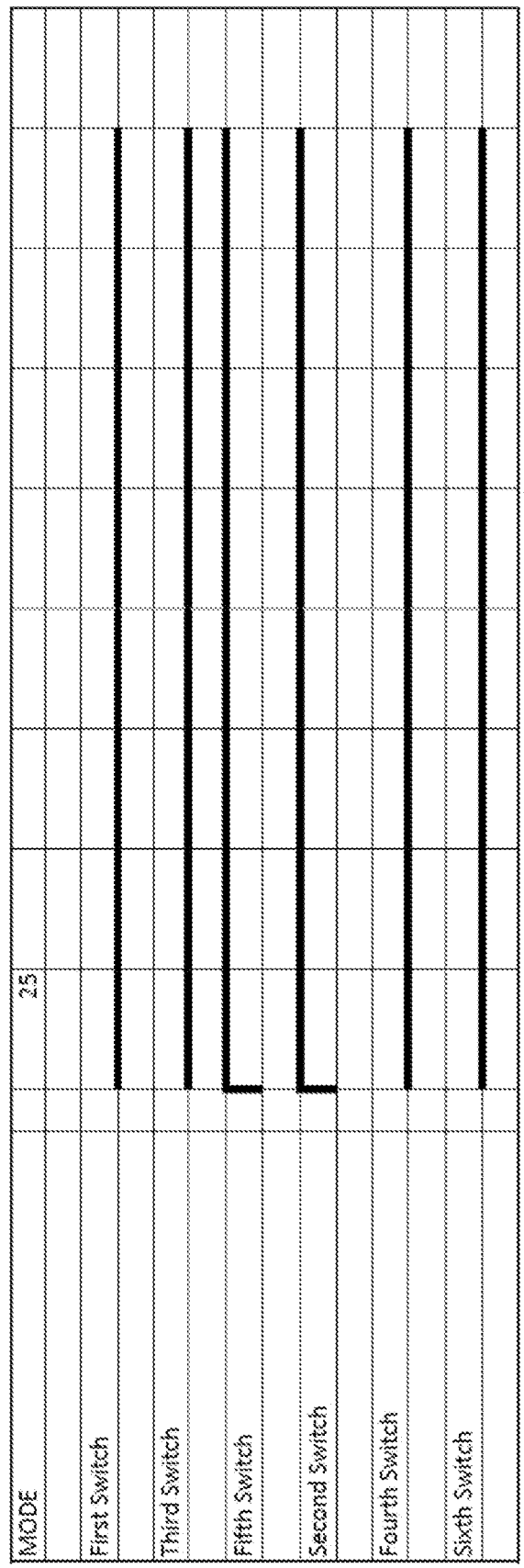
Figure 5H:
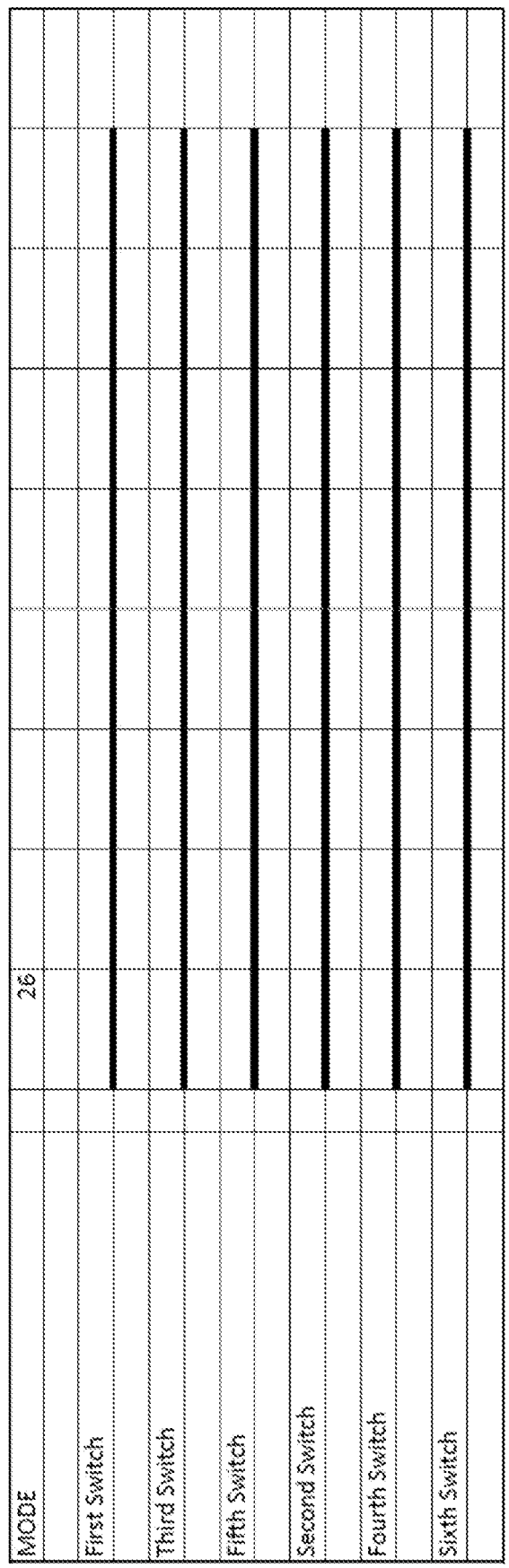
Figure 5I:
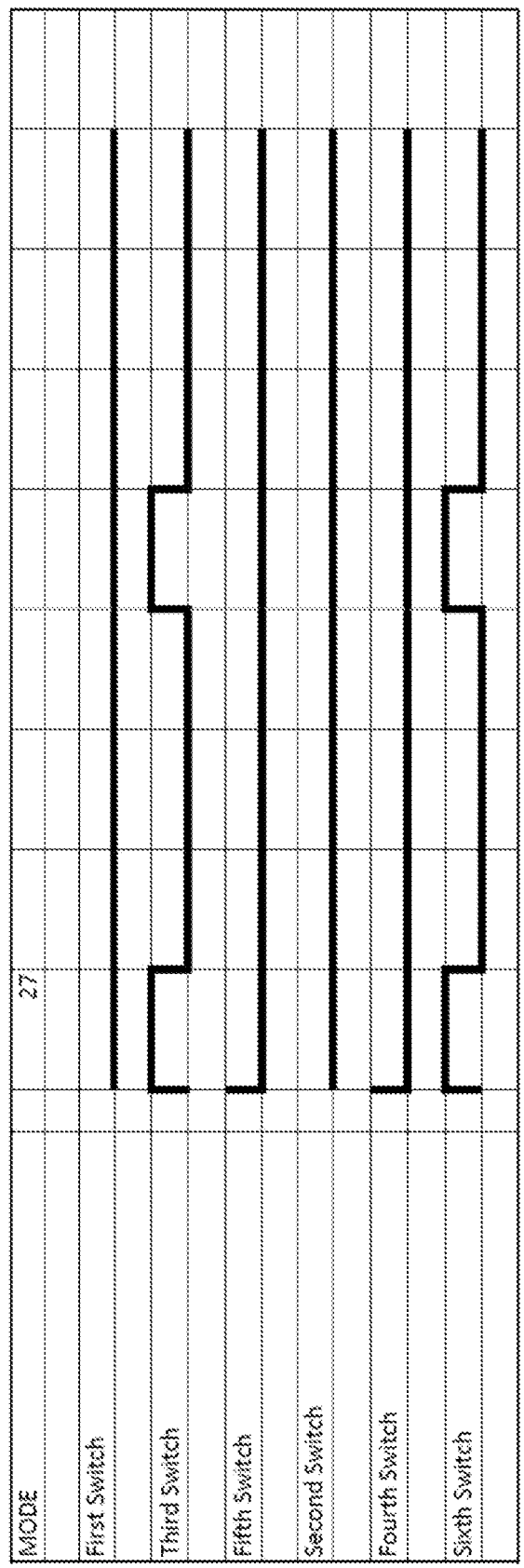
Figure 5J:
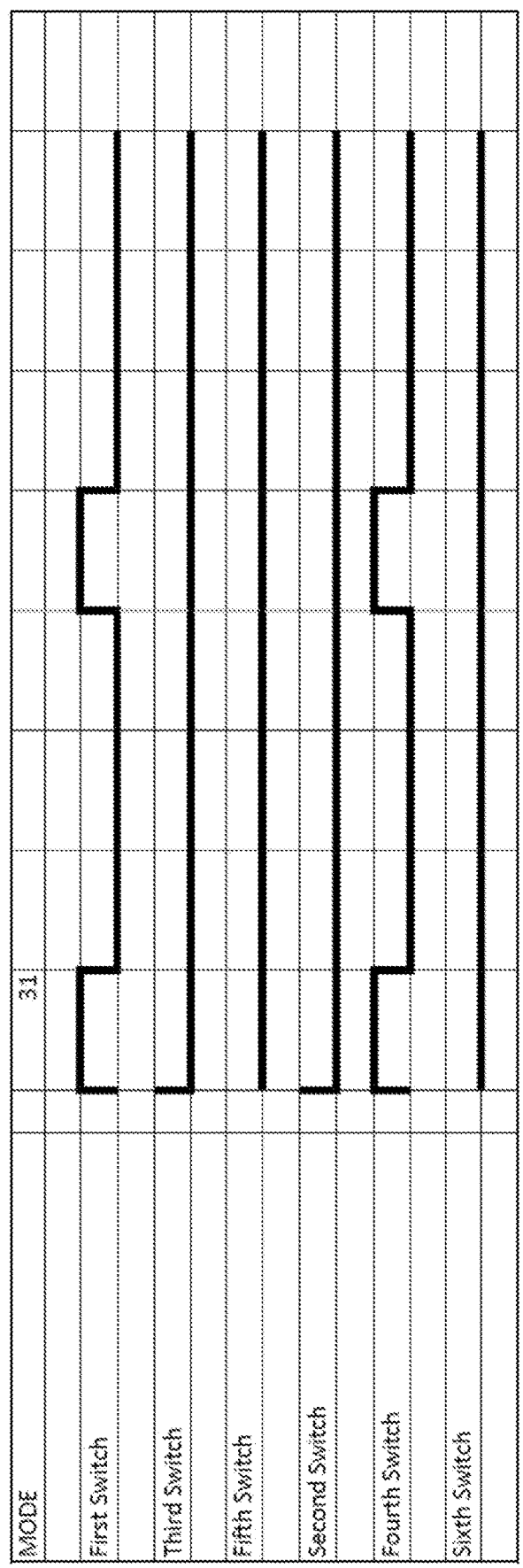
Figure 5K:
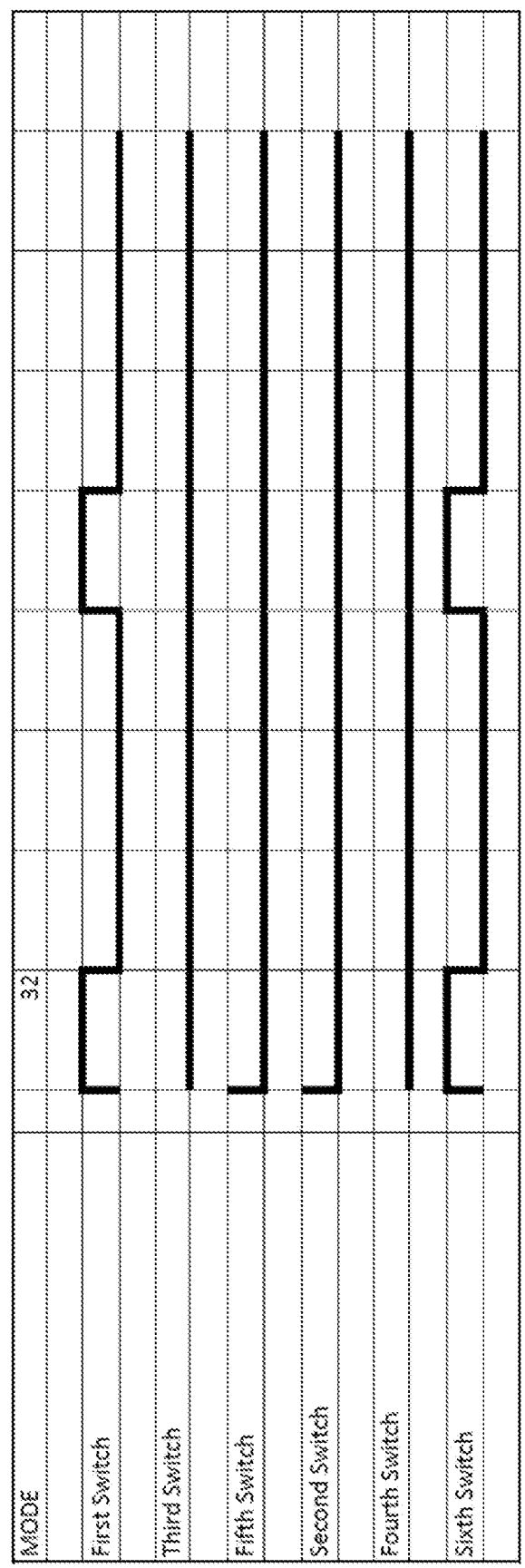
Figure 5L:
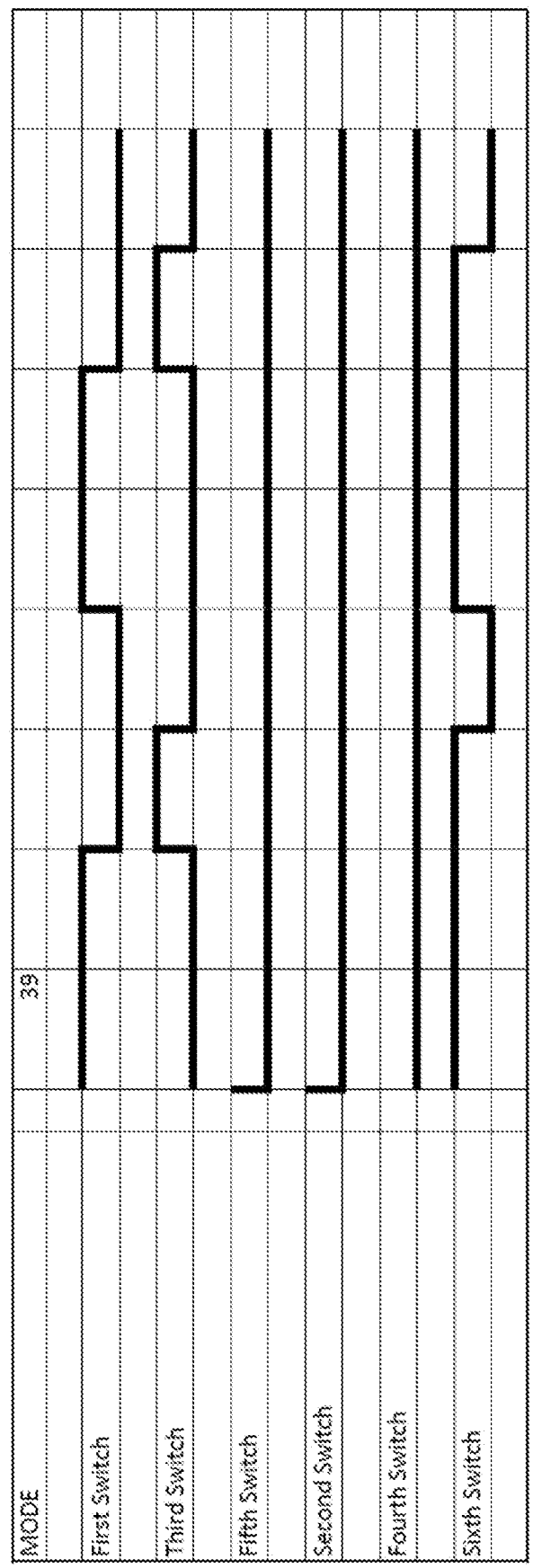
Figure 5M:
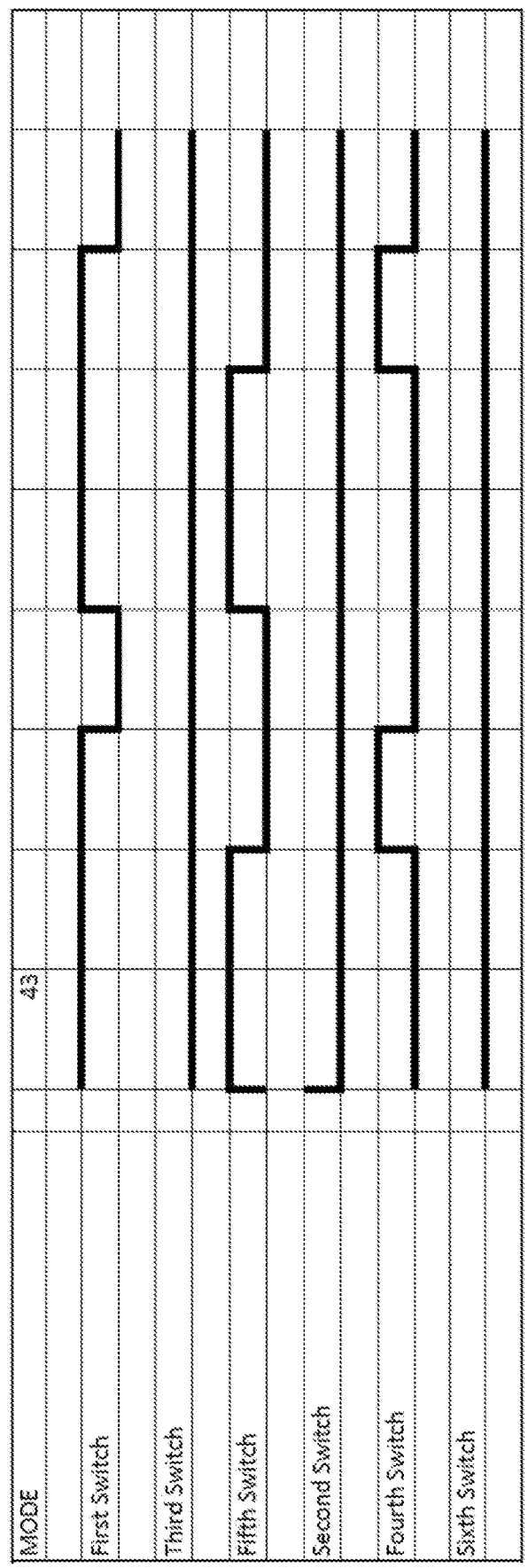
Figure 5N:
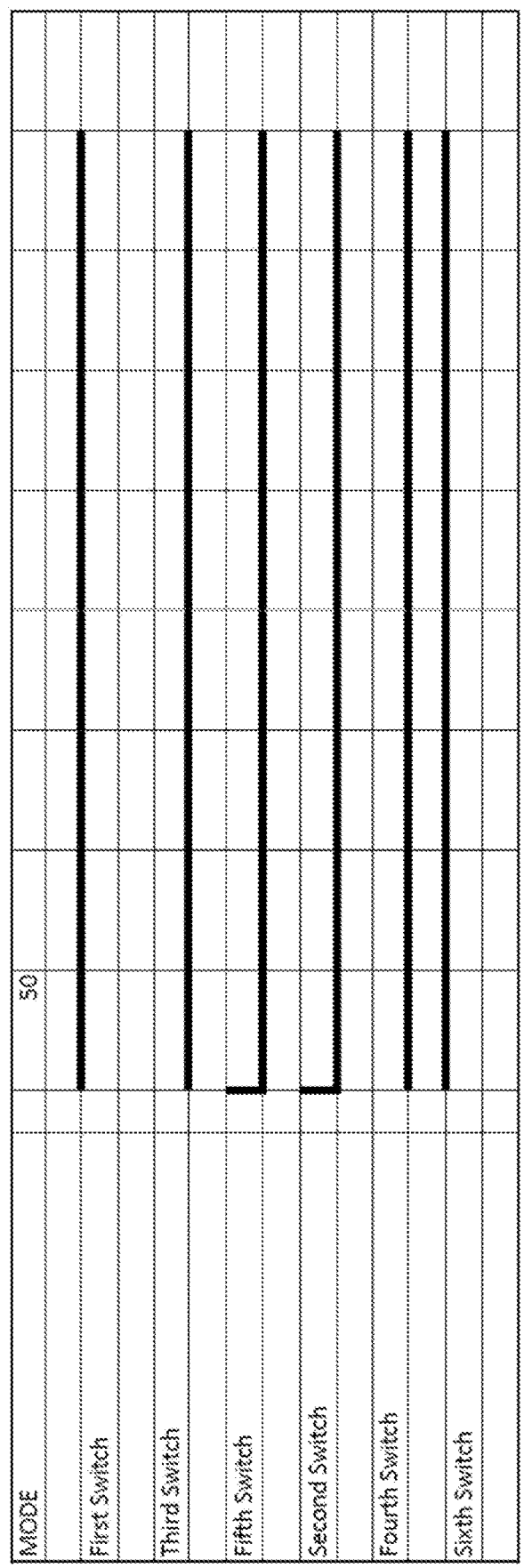

For example, with respect to FIG. 5E, this waveform represents the switch states for an operating mode where first zone and the second zone are being cooled, the driver has cooling set to position 2 and the passenger has cooling set to position 3. In this operating mode, as illustrated in FIG. 5E, the switches 130A through 130F are placed in State 6 for the initial two time slices (half a second), then the switches 130A through 130F are placed in State 4 for one time slice (quarter of a second), and then the switches 130A through 130F are placed in the "OFF" state for one time slice (quarter of a second). Accordingly, in State 6, both the first zone and the second zone are cooled but in State 4, only the second zone (passenger zone) is cooled, as the passenger temperature level is set higher (colder) than the driver temperature level.

Accordingly, as illustrated in the waveforms, even in open loop control, during a mode of operation the switches 130A through 130F can toggle between independent states, series states, and OFF states when both zones are being heated or cooled but at different temperature setpoints. In closed loop control, this same toggling occurs but the duration of operating in each state may vary. Furthermore, independent operation may also occur when both zones are set to a non-zero (not OFF) level due to feedback regulation. For example, if the first zone heats up faster than the second zone during series operation, the control can switch to independent control to bypass the first zone while continuing to heat the second zone until the second zone reaches its associated temperature setpoint. In addition, there is also a possibility of both zones being OFF at the same time when only one zone is actually set to the OFF level, such as when feedback regulation is being used and a zone reaches its temperature setpoint.

It should also be understood that the waveforms are not illustrating the entire control algorithm for some embodiments. For example, in some embodiments, the control algorithm flip flops between independent (single element) operation and series operation and off as needed to maintain a particular temperature setpoint (selected via the heating/ cooling settings input by a user). In addition, the waveforms do not show the closed loop control that dynamically adjusts duty cycle based on detected error. The waveforms also do not show the timer feature described herein that allows a steady state to be reached quickly through an override of the duty cycle commanded by the user in open loop operation.

Figure 6:
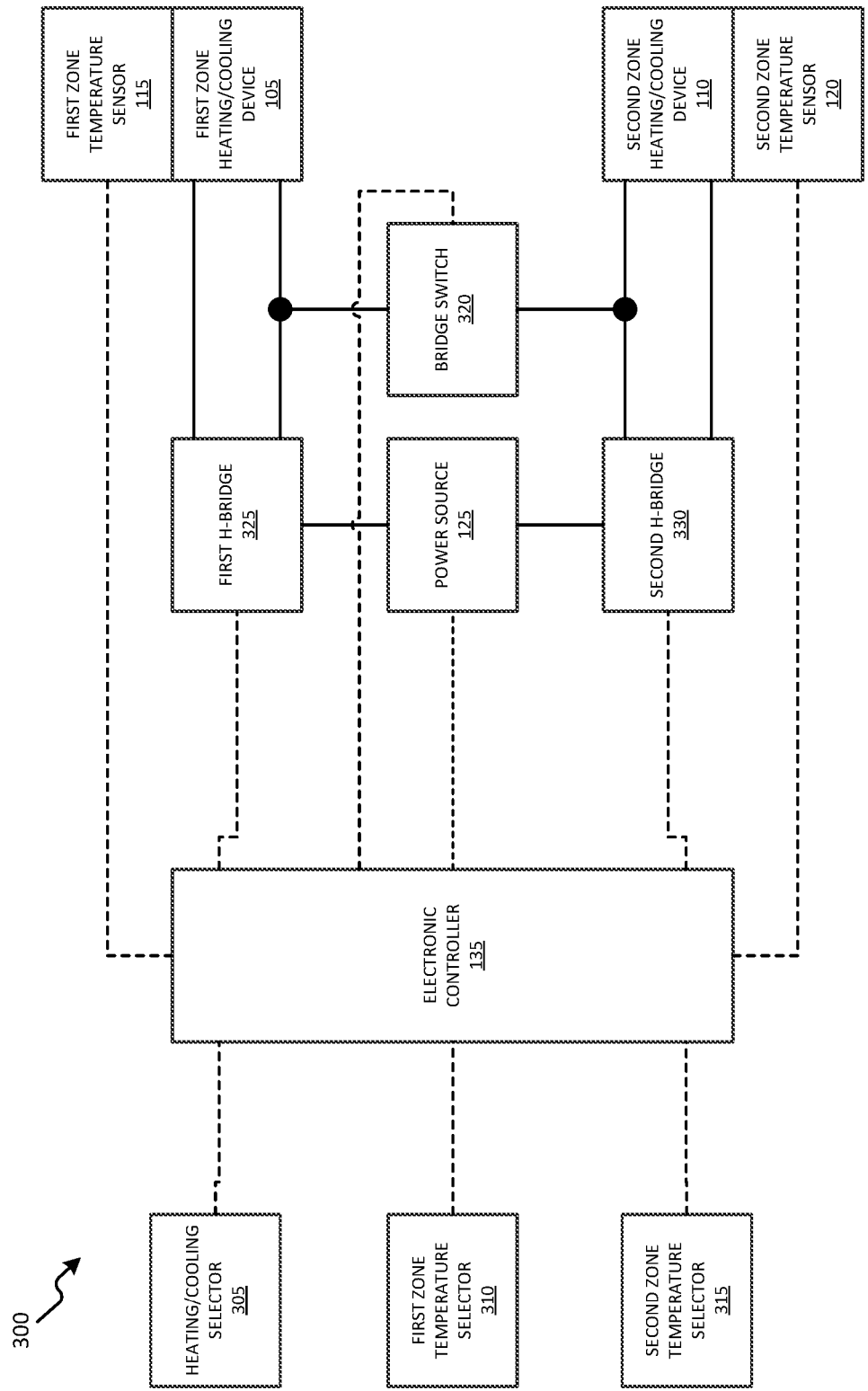
FIG. 6 is a diagram of an alternative dual zone climate control system for a vehicle, in accordance with some embodiments.

FIG. 6 is a diagram of another example embodiment of a dual zone climate control system 300 for a vehicle (for example, a motorcycle). In the embodiment illustrated, the dual zone climate control system 300 includes a first zone heating/cooling device 105 (for a driver seat), a second zone heating/cooling device 110 (for a passenger seat), a first zone temperature sensor 115, a second zone temperature sensor 120, a heat/cool selection switch 305, a driver temperature selection knob 310, a passenger temperature selection knob 315, a power source 125, and an electronic controller 135. In alternate embodiments, the dual zone climate control system 200 may include fewer or additional components in configurations different from the configuration illustrated in FIG. 6. Components with matching references numbers to components in FIGS. 1 and 2 include similar configurations and example components as described above with respect to these figures.

The electronic controller 135 is configured to monitor vehicle input voltage and remove power to output switches in the event the voltage exceeds a threshold (for example, 16 volts DC or 9 volts DC). The electronic controller 135 is also configured to receive desired temperature levels from the driver and passenger through the heat/cool selection switch 305, the driver temperature selection knob 310, and the passenger temperature selection knob 315. The heat/cool selection switch 305 selects heating or cooling functions for both the driver and the passenger. The driver temperature selection knob 310 (for example, a rotary dial or detent potentiometer) provides a plurality of set points for the driver (for example, OFF, LOW, MEDIUM, MEDIUM-HIGH, and HIGH). The passenger temperature selection knob 315 (for example, a rotary detent potentiometer) provides a plurality of set points for the passenger (for example, OFF, LOW, MEDIUM, MEDIUM-HIGH, and HIGH). The electronic controller 135 is also configured to switch power to the driver and passenger seat heating/cooling element assembly via an H-bridge driver, which includes a bridge switch 320, a first H-bridge 325, and a second H-bridge 330. Positive polarity is used to heat the seat surface and negative polarity is used to cool the seat surface. The electronic controller 135 is also configured to monitor the driver and passenger seat surface temperatures. The electronic controller 135 is also configured to provide a constant current drive of heating/cooling elements. In some embodiments, the electronic controller 135 provides a constant current drive to heating/cooling elements by controlling both elements in series or switching to a parallel/independent operation of the elements via, for example, a solid state relay or reed switch. In some embodiments, the electronic controller 135 is also configured to switch power to one or more fans during cooling modes, via high side drivers.

As described above with respect to the system 100, in the system 300, the electronic controller 135 is configured to operate or control the system 300 for a plurality of operating modes, wherein each mode may include one or more states of the first H-bridge 325, the second H-bridge 330, and the bridge switch 320. As the bridges include similar switches as included in the system 100, the states are similar to those described above with respect to the system 100 and are not described herein for brevity. In particular, by holding the center half bridge open and holding the bridge switch closed, the configuration of the system 300 effectively becomes the configuration of the system 100 where all the switch states described above apply the same way since one leg has effectively been removed and the remaining three legs have been hardwired together. However, as compared to FIGS. 1 and 2, FIG. 6 includes a four leg configuration. As described above with respect to FIGS. 1 and 2, only three of these four legs may be needed to independently control the zones.

Accordingly, as compared to FIG. 6, the embodiment illustrated in FIGS. 1 and 2 may include fewer components, which results in reduced complexity and cost and power savings.

In some embodiments, the power source 125 includes a single power supply device (for example, a switched-mode power supply) that feeds current into the two H-bridges. In alternate embodiments, the power source 125 includes a single power supply device that feeds voltage into the two H-bridges to provide a single voltage rail that may or may not be dynamically adjustable in amplitude. In alternate embodiments, the power source 125 includes two power supply devices that each feed voltage into one of the two H-bridges to generate different voltage rails. In alternate embodiments, the power source 125 includes a single power supply device that feeds current into the two H-bridges that may or may not be dynamically adjustable (in amplitude). In alternate embodiments, the power source 125 includes two power supply devices that each feed current into one of the two H-bridges. While two power supply device implementations may provide better current (or voltage) control, they also increase the cost and the footprint as compared to a single supply system.

It should be understood that although the examples described herein are provided for heating two seats of a vehicle, such as a motorcycle, the invention is not limited to this implementation. For example, the systems and methods described herein may be used for more than two zones and may be used for other surfaces than just seats, such as, for example, handgrips, arm rests, foot rests, or the like included in the vehicle (including a seat or other surfaces included in a side car). Accordingly, the heating and cooling described herein may be used to for any surface on a vehicle interacting with any portion of a user, including, hand and foot controls as well as resting interfaces (art rests, leg rests, etc.). Furthermore, in some embodiments, the multi-zone climate control system can be used to create zones within a single component within a vehicle, such as the seat and backrest of a single seat or a thigh versus a rear zone of a seat.

Also, in some embodiments, to expand the systems and methods described herein to additional zones, shorting switches may be added parallel to certain zones. For example, to add a third zone, a seventh switch can be added coupled between a power source and a fourth junction and an eighth switch can be added coupled between the fourth junction and a reference terminal (ground), wherein a third zone heating/cooling device can be coupled between the third junction 165 (see FIG. 1) and the fourth junction. A shorting switching can also be coupled between the second junction 155 (see FIG. 1) and the third junction 165. The shorting switch (on the center zone) allows any of the three zones to be in series (1-2, 1-2-3, 2-3, 1-3) in either direction and each zone can be operated independently/bi-directionally. The system can also be expanded to additional zones, such as fourth and fifth zones, as long as the center zones each have a shorting switch.

In particular, for expansion purposes, only inner legs (not first and second) may need shorting switches (unless parallel control is used). However, if top inner legs are removed, all the elements may need shorting switches, which could be used to reduce the overall number of switches if enough zones are used. Furthermore, in some embodiments the systems and methods described herein may be used to run one element as a heating element and another element as a cooling element. For example, the 3-leg configuration may be used with a parallel configuration to regulate both heating and cooling simultaneously. In such implementation, a current balancing circuit may also be added to reduce peak currents.

Various features and advantages of some embodiments are set forth in the following claims.

What is claimed is:

1. A multi-zone climate control system for a vehicle, the system comprising:
   a power source;
   a plurality of switches including
      a first switch coupled between the power source and a first junction,
      a second switch coupled between the first junction and a reference terminal,
      a third switch coupled between the power source and a second junction,
      a fourth switch coupled between the second junction and the reference terminal,
      a fifth switch coupled between the power source and a third junction, and
      a sixth switch coupled between the third junction and the reference terminal;
   a first zone heating/cooling device coupled between the first junction and the second junction;
   a second zone heating/cooling device coupled between the second junction and the third junction; and
   an electronic controller configured to operate the plurality of switches to supply current bi-directionally through the first zone heating/cooling device, bi-directionally through the second zone heating/cooling device, or bi-directionally through a series connection of the first zone heating/cooling device and the second zone heating/cooling device.

2. The multi-zone climate control system of claim 1, wherein the electronic controller is further configured to
   receive a first zone temperature selection,
   determine a first duty cycle for the first zone heating/cooling device based on the first zone temperature selection, and
   operate the plurality of switches to supply current to the first zone heating/cooling device at the first duty cycle.

3. The multi-zone climate control system of claim 2, wherein the electronic controller is further configured to
   receive a second zone temperature selection,
   determine a second duty cycle for the second zone heating/cooling device based on the second zone temperature selection, and
   operate the plurality of switches to supply current to the second zone heating/cooling device at the second duty cycle.

4. The multi-zone climate control system of claim 1, further comprising a first zone temperature sensor, wherein the electronic controller is further configured to
   receive a first zone temperature selection indicating a first setpoint temperature,
   receive a first temperature measurement from the first zone temperature sensor,
   determine a first difference between the first temperature measurement and the first setpoint temperature,
   determine a first duty cycle for the first zone heating/cooling device based on the first setpoint temperature and the first difference between the first temperature measurement and the first setpoint temperature, and
   operate the plurality of switches to supply current to the first zone heating/cooling device at the first duty cycle.

5. The multi-zone climate control system of claim 4, further comprising a second zone temperature sensor, wherein the electronic controller is further configured to
receive a second zone temperature selection indicating a second setpoint temperature,
receive a second temperature measurement from the second zone temperature sensor,
determine a second difference between the second temperature measurement and the second setpoint temperature,
determine a second duty cycle for the second zone heating/cooling device based on the second setpoint temperature and the second difference between the second temperature measurement and the second setpoint temperature, and
operate the plurality of switches to supply current to the second zone heating/cooling device at the second duty cycle.

6. The multi-zone climate control system of claim 1, wherein the electronic controller is further configured to
receive a new temperature selection,
determine a first duty cycle for the first zone heating/cooling device based on the new temperature selection,
determine a difference between the new temperature selection and a previous temperature selection,
determine a period of time based on the difference between the new temperature selection and the previous temperature selection,
operate the plurality of switches to supply current to the first zone heating/cooling device at a full duty cycle for the period of time, and
subsequently operate the plurality of switches to supply current to the first zone heating/cooling device at the first duty cycle after the period of time.

7. The multi-zone climate control system of claim 1, wherein the electronic controller is further configured to
receive a heating/cooling selection,
operate the plurality of switches to supply current in a first direction through the series connection of the first zone heating/cooling device and the second zone heating/cooling device when the heating/cooling selection indicates cooling, and
operate the plurality of switches to supply current in a second direction through the series connection of the first zone heating/cooling device and the second zone heating/cooling device when the heating/cooling selection indicates heating.

8. The multi-zone climate control system of claim 1, wherein the plurality of switches further includes
a seventh switch coupled between the power source and a fourth junction, and
an eighth switch coupled between the fourth junction and the reference terminal,
wherein the multi-zone climate control system further includes
a third zone heating/cooling device coupled between the third junction and the fourth junction, and
a shorting switching coupled between the second junction and the third junction.

9. The multi-zone climate control system of claim 1, wherein the electronic controller is further configured to
receive a first zone temperature selection and a second zone temperature selection,
operate the plurality of switches to supply current through the first zone heating/cooling device when the first zone temperature selection indicates a first setpoint temperature and the second zone temperature selection indicates OFF,
operate the plurality of switches to supply current through the second zone heating/cooling device when the first zone temperature selection indicates OFF and the second zone temperature selection indicates a second setpoint temperature, and
operate the plurality of switches to supply current through the series connection of the first zone heating/cooling device and the second zone heating/cooling device when the first zone temperature selection indicates the first setpoint temperature and the second zone temperature selection indicates the second setpoint temperature.

10. The multi-zone climate control system of claim 1, wherein the power source includes a switched-mode power supply, a linear power supply, or a battery.

11. The multi-zone climate control system of claim 1, wherein the first zone heating/cooling device is positioned within a first seat of the vehicle, and wherein the second zone heating/cooling device is positioned within a second seat of the vehicle.

12. The multi-zone climate control system of claim 1, wherein the first zone heating/cooling device and the second zone heating/cooling device are positioned within a seat of the vehicle.

13. The multi-zone climate control system of claim 1, wherein the first zone heating/cooling device is positioned within a seat of the vehicle, and wherein the second zone heating/cooling device is positioned within a backrest of the vehicle.

14. The multi-zone climate control system of claim 1, wherein the first zone heating/cooling device is positioned within a hand control of the vehicle, a foot control of the vehicle, or a resting interface of the vehicle.

15. A multi-zone climate control system for a vehicle, the multi-zone climate control system comprising:
an interface configure to:
receive a first temperature selection associated with a first zone heating/cooling device included in the vehicle, and
receive a second temperature selection associated with a second zone heating/cooling device included in the vehicle; and
a processor configured to operate a plurality of switches in the vehicle in a manner that places the plurality of switches in:
a first state, in response to the first temperature selection being an OFF level and the second temperature selection not being the OFF level, to supply current to the second zone heating/cooling device and to not supply current to the first zone heating/cooling device,
a second state, in response to the first temperature selection not being the OFF level and the second temperature selection being the OFF level, to supply current to the first zone heating/cooling device and to not supply current to the second zone heating/cooling device, and
a third state, in response to the first temperature selection not being the OFF level and the second temperature selection not being the OFF level, to connect the first zone heating/cooling device and the second zone heating/cooling device in series and supply current to both the second zone heating/cooling device and the first zone heating/cooling device.

16. The multi-zone climate control system of claim 15, wherein the processor is configured to:
   determine, in response to the first temperature selection not being an OFF level and the second temperature selection being the OFF level, a first duty cycle for the first zone heating/cooling device based on the first temperature selection and supplying current to the first zone heating/cooling device at the first duty cycle.

17. The multi-zone climate control system of claim 16, wherein the processor is configured to:
   determine, in response to the first temperature selection being an OFF level and the second temperature selection not being the OFF level, a second duty cycle for the second zone heating/cooling device based on the second temperature selection and supplying current to the second zone heating/cooling device at the second duty cycle.

18. The multi-zone climate control system of claim 15, wherein, in response to the first temperature selection not being an OFF level and the second temperature selection being the OFF level,
   the processor is configured to:
      receive a temperature measurement from a temperature sensor associated with the first zone heating/cooling device,
      determine a difference between the temperature measurement and a temperature setpoint associated with the first temperature selection; and
   the switches are configured to:
      supply current to the first zone heating/cooling device based on the temperature setpoint and the difference between the temperature measurement and the temperature setpoint.

19. The multi-zone climate control system of claim 15, wherein, in response to the first temperature selection being the OFF level and the second temperature selection not being the OFF level,
   the processor is configured to:
      receive a temperature measurement from a temperature sensor associated with the second zone heating/cooling device, and
      determine a difference between the temperature measurement and a temperature setpoint associated with the second temperature selection; and
   the switches are configured to:
      supply current to the second zone heating/cooling device based on the temperature setpoint and the difference between the temperature measurement and the temperature setpoint.

20. The multi-zone climate control system of claim 15, wherein, in response to the first temperature selection not being the OFF level and the second temperature selection not being the OFF level and before or after operating the plurality of switches to place the plurality of switches in the third state,
   the processor is configured to:
      operate, with the electronic controller, the plurality of switches to place the plurality of switches in the first state or the second state based on a difference between the first temperature selection and the second temperature selection.

* * * * *